(12) United States Patent
Choo et al.

(10) Patent No.: US 10,594,333 B1
(45) Date of Patent: Mar. 17, 2020

(54) ANALOG-TO-DIGITAL CONVERSION CIRCUIT AND IMAGE SENSOR INCLUDING THE SAME

(71) Applicant: The Regents of The University of Michigan, Ann Arbor, MI (US)

(72) Inventors: Kyojin Choo, Ann Arbor, MI (US); Dennis Sylvester, Ann Arbor, MI (US); David T. Blaauw, Ann Arbor, MI (US); Li Xu, Shenzhen (CN)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/277,163

(22) Filed: Feb. 15, 2019

(51) Int. Cl.
*H03M 1/46* (2006.01)
*H04N 5/378* (2011.01)

(52) U.S. Cl.
CPC ........... *H03M 1/466* (2013.01); *H03M 1/462* (2013.01); *H04N 5/378* (2013.01)

(58) Field of Classification Search
CPC ....... H03M 1/466; H03M 1/462; H04N 5/378
USPC .................................................. 341/155, 172
See application file for complete search history.

(56) References Cited

U.S. PATENT DOCUMENTS 8,816,892 B2 *   8/2014   Huang ................. H03M 1/687
                                                       341/118
10,001,406 B2 *  6/2018   Panicacci ............. G01J 1/4228

OTHER PUBLICATIONS

K. Choo, et al Area-Efficient 16S/s 6b SAR ADC with Charge-Injection-Cell-Based DAC, 2016 IEEE International Solid-State Circuits Conference (2016).

* cited by examiner

*Primary Examiner* — Khai M Nguyen
(74) *Attorney, Agent, or Firm* — Harness, Dickey & Pierce, P.L.C.

(57) ABSTRACT

An analog-to-digital converter (ADC) circuit is present, which is particularly suitable for use in an image sensor. The ADC circuit includes a comparator and a digital-to-analog converter (DAC) circuit. The DAC circuit includes two or more charge paths electrically coupled to the output node. Each charge path is formed by one or more charge-injection cells electrically coupled via a gain capacitor to the output node, and a charge conversion capacitor electrically coupled in parallel with the one or more charge-injection cells. Each charge-injection cell is configured to transfer a fixed amount of charge from a charge source to an associated charge path and includes at least one switch configured to isolate the charge source from the output node.

23 Claims, 7 Drawing Sheets

1

ANALOG-TO-DIGITAL CONVERSION CIRCUIT AND IMAGE SENSOR INCLUDING THE SAME

FIELD

The present disclosure relates to an analog-to-digital conversion circuit and an image sensor including the same.

BACKGROUND

As the Internet of Things (IoT) is increasingly integrated into our everyday life, the demand for different sensor modalities, especially imaging, is rising. IoT imagers are often compact and have small form-factor batteries and thus must be designed with both low power (improving battery life) and high image quality (maximizing utility). Previously reported sensors adopted motion-detection (MD) triggering of full-array capture where motion detection is performed on a heavily subsampled frame to enable continuous low-power operation. Motion detection limits energy-hungry full-array captures to cases where activity is detected. To further reduce power consumption, the full-frame capture energy itself needs to be addressed, which is typically dominated by the ADC.

Conventional imagers use a single slope ADC with 4T pixel structure, which provides high fidelity but is inherently energy inefficient. This is particularly the case at higher resolution due to its exponential energy scaling with bit width or when used in conjunction with sub-sampling. SAR-based ADCs have superior energy efficiency and are used extensively in other application areas. However, to date SAR ADCs have been rarely used in imagers due to their large size and limited accuracy. To achieve both high quality and low power, this disclosure proposes an energy-efficient, low-noise capacitor array-assisted charge-injection SAR ADC (c-ciSAR) structure. The structure merges an area efficient charge-injection cell (ci-cell) with a small capacitor array structure to extend its performance to 10$b$. The merged capacitor array and charge-injection cell structure achieves significantly higher ADC energy efficiency compared to a single-slope ADC, with a measured ADC FoM of 14.4 uV·nJ (full capture mode) and 90.4 uV·pJ (motion detection mode).

This section provides background information related to the present disclosure which is not necessarily prior art.

SUMMARY

This section provides a general summary of the disclosure, and is not a comprehensive disclosure of its full scope or all of its features.

An improved analog-to-digital converter (ADC) circuit is presented. The ADC circuit is comprised of a comparator and a digital-to-analog converter (DAC) circuit. The DAC circuit includes an output node electrically coupled to an input of the comparator and configured to output a reference voltage to the comparator. The DAC circuit further includes two or more charge paths electrically coupled to the output node. Each charge path is formed by one or more charge-injection cells electrically coupled via a gain capacitor to the output node, and a charge conversion capacitor electrically coupled in parallel with the one or more charge-injection cells. Capacitance of the gain capacitors may vary across the two or more charge paths. Each charge-injection cell is configured to transfer a fixed amount of charge from a charge source to an associated charge path and includes at least one switch configured to isolate the charge source from the output node.

In one embodiment, each charge-injection cell includes a first transistor, a second transistor and a source capacitor, where the first transistor is in series with the second transistor and the source capacitor is electrically coupled to a node interconnecting the first transistor and the second transistor. Each charge-injection cell further includes a biasing transistor interconnected between the first transistor and the second transistor, such that the biasing transistor is in a cascoded arrangement with the first transistor and the source capacitor is electrically coupled to a node interconnecting the biasing transistor and the second transistor. A controller is electrically coupled to a control terminal of the biasing transistor, where magnitude of the charge transferred by corresponding charge-injection cell directly correlates with voltage applied to the control terminal of the biasing transistor by the controller.

In some embodiments, the controller is interfaced with each of the charge-injection cells in each of the two or more charge paths, and the controller quantizes value of the input signal by adjusting magnitude of the reference voltage in accordance with a coarse linear search followed by a binary search.

In some embodiments, the controller operates each of the charge-injection cells in each of the two or more charge paths to quantizes value of the input signal using a binary integer, where quantization of least significant bit of the binary integer is repeated multiple times.

In other embodiments, the controller operates each of the charge-injection cells in each of the two or more charge paths to quantizes value of the input signal using successive approximation cycles, where the comparator is fired multiple times within a given cycle and a value for the given cycle is based on multiple outputs from the comparator during the given cycle.

The analog-to-digital converter circuit may be integrated into an image sensor.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
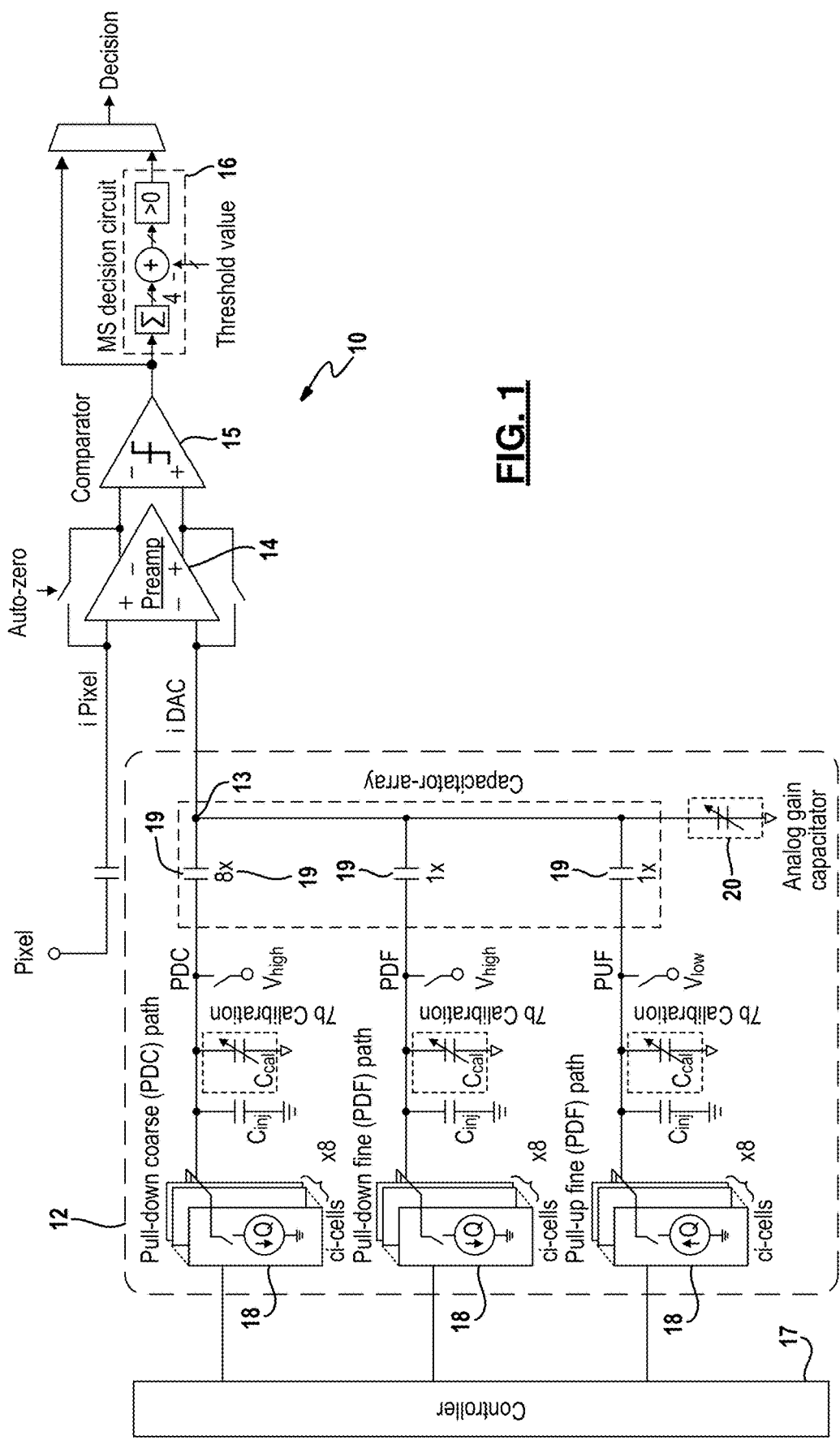
FIG. 1 is a schematic of an example embodiment of an analog-to-digital converter (ADC).

FIG. 1 depicts an example embodiment of an analog-to-digital converter (ADC) circuit 10. The ADC circuit 10 is comprised of a digital-to-analog converter (DAC) circuit 12, a pre-amplifier 14, a comparator 15 and a MS decision circuit 16. The comparator 15 is configured to receive an input signal and a reference voltage. In the example embodiment, the input signal is a pixel value from an image sensor. While reference is made throughout this application to input from an image sensor, it is understood that the ADC circuit is suitable for other applications, especially those with a DC input signal.

The DAC circuit 12 operates to generate the reference voltage which is compared to the pixel voltage. The reference voltage is shared with the comparator 15 via an output node 13 of the DAC circuit 12. The DAC circuit 12 preferably includes two or more charge paths electrically coupled to the output node 13. In the example embodiment, the DAC circuit 12 include three charge paths although more or less are contemplated by this disclosure. Specifically, the DAC circuit employs a coarse pull-down charge path, a fine pull-down charge path and a fine pull-up charge path, where the transistors in the pull down path operate in a pull down mode and the transistors in the pull up path operate in a pull up mode. Having one two types of charge-injection cells (up, down) reduces design complexity. It is also noted that the array of gain capacitors reduces the number of charge-injection cell activations by 4.3× for $10b$ ADC operation, thereby enabling compact and energy-efficient DAC design. Collectively, the charge paths provide the voltage (at the output node 13) that forms the reference voltage.

Each charge path includes a charge conversion capacitor $C_{inj}$, a gain capacitor 17 and one or more charge-injection cells 18. More specifically, each charge-injection cell 18 is electrically coupled to the output node 13, the gain capacitor 17 is electrically coupled in series between the output node 13 and the one or more charge-injection cells 18, and the charge conversion capacitor $C_{inj}$ is electrically coupled in parallel with the one or more charge-injection cells 18. Each charge path may further include a calibration capacitor $C_{cal}$. The purpose of $C_{cal}$ is to provide trimming capability of $C_{inj}$ to compensate for variations occurring during manufacturing and even in design. $C_{cal}$ supplements $C_{inj}$ so that the charge-injection DAC performance so that the voltage output per charge-inject operation in the DAC may become uniform across multiple column ADCs included. The $C_{cal}$ is sub-partitioned into smaller capacitor sizes and will be electrically contributing or not contributing to $C_{cal}$ depending on the control signal. Other circuit arrangements for a charge path are also contemplated by the broader aspects of this disclosure.

One or more analog gain capacitors 20 are also added at the output of the DAC, providing extra capacitance to the capacitive divider that is already formed from parallel capacitance from multiple charge-injection paths. With enabling from the analog gain capacitor 20, the DAC will output smaller voltage change per each charge-injection cell operation and therefore will make the DAC higher resolution in terms of voltage. With higher resolution, the SAR ADC using this DAC output will convert the same analog voltage into higher code.

During operation, each charge-injection cell is configured to transfer a fixed amount of charge from a charge source to its associated charge path. The charge conversion capacitor Cinj in the charge path converts the charge from each of the one or more charge-injection cells to voltage. To transfer voltages in different magnitude ranges, the capacitance of the gain capacitors 19 may vary across the charge paths. In the example embodiment, ratio between the gain capacitors is 8×, 1× and 1× for the upper charge path, middle charge path and lower charge path, respectively. Voltage from each charge path is in turn summed at the output node to form the reference voltage.

Magnitude of the voltage supplied by a given charge path can be controlled in different ways. In one example, the charge path includes one charge-injection cell 18. In this example, the charge-injection cell 18 is activated multiple times to transfer a fixed amount of charge to the charge conversion capacitor Cinj which in turn stores the accumulated voltage for subsequent delivery to the output node 13.

In another example, the charge path includes a plurality of charge-injection cells 18, such that each charge-injection cell 18 can transfer charge simultaneously to the charge path. For example, the number of charge-injection cells in a given charge path can be set at $2^n$ (e.g., 8), where n is bits of resolution for value of charge transferred to the associated charge path.

Figure 2A:
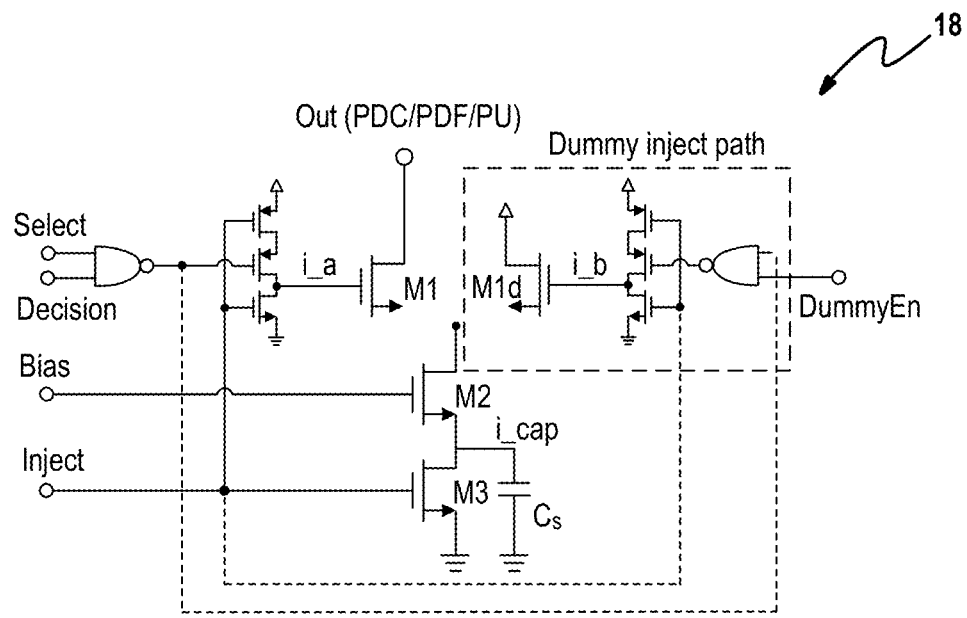
FIG. 2A is a schematic for an example embodiment of a charge-injection cell.
Figure 2B:
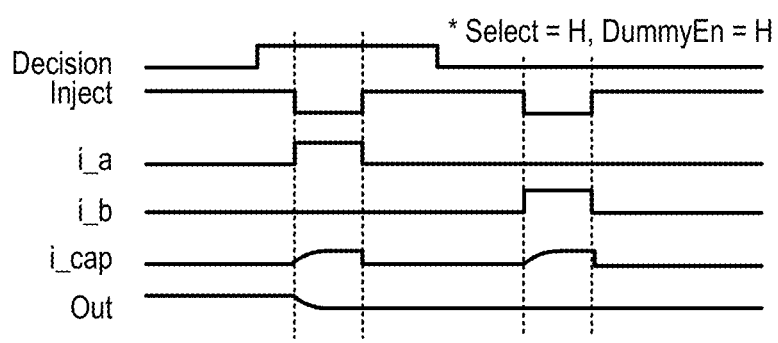
FIG. 2B is a diagram depicting signals of the charge-injection cell.

FIGS. 2A and 2B further illustrate an example embodiment for a charge-injection cell 18. The charge-injection cell 18 includes at least one switch configured to isolate the charge source from the output node. More specifically, the charge includes a first transistor M1, a second transistor M3 and a source capacitor Cs. The first transistor M1 is electrically coupled in series with the second transistor M2 and the source capacitor Cs is electrically coupled to a node interconnecting the first transistor M1 and the second transistor M3. The charge-injection cell 18 further includes a biasing transistor M2 interconnected between the first transistor M1 and the second transistor M3, such that the biasing transistor M2 is in a cascaded arrangement with the first transistor M1 and the source capacitor Cs is electrically coupled to a node interconnecting the biasing transistor M2 and the second transistor M3. The magnitude of the charge transferred by the charge-injection cell directly correlate with the voltage applied to the control terminal of the biasing transistor M2.

Operation of charge-injection cells is further described in relation to FIG. 2B. For each charge-injection cell 18, the Inject bar signal pulses low to transfer constant charge from output (Out) and induces a repeatable change in its voltage. During each injection, the voltage on node i_cap rises from its reset value (Gnd) to the voltage controlled by the signal applied to the control terminal of the biasing transistor M2, whose value sets the charge-injection amount. The cascade configuration of biasing transistor M2 and the direction steering switches (M1 and M1d) greatly improve the output impedance of the charge-injection cell 18 and enables ten bit linearity. The charge conversion capacitor Cinj is pre-charged to a sufficiently high voltage (e.g., 3.4 V) during auto-zero phase to ensure that first and second transistors M1, M2 operate in saturation mode throughout the ADC sequence. The dummy injection path makes the current draw from the power supply decision independent, which ensures a constant injection charge even for high impedance power supply regulation. This enables low power overhead supply regulation, which is often needed in battery-operated devices.

Returning to FIG. 1, the comparator 15 compares the input signal to a reference voltage received from the DAC circuit 12. In one embodiment, the comparator uses a StrongARM structure having two inputs. Comparators having only one input as well as more than two inputs are also contemplated by this disclosure. The pre-amplifiers 14 precedes the comparator 15. In the example embodiment, the pre-amplifier 14 may be implemented with an NMOS-input 5T-OTA arrangement. Auto-zeroing (DC decoupling) capacitors are applied at both input branches of the pre-amplifier 14. Other implementations for the pre-amplifier 14 and the comparator 15 are also contemplated by this disclosure.

In the example embodiment, a MS decision circuit 16 is also included. This circuit includes a digital counter which can count up or down given an activation pulse as well as an adder or a subtractor. The input to the digital counter is connected to the comparator 15 output and is activated once, but not limited to, every comparator decision. The counter accumulates multiple comparator decisions in order to make a combined and more accurate decision in accounting for noise affecting the preamp 14, the input signal, and the comparator 16 which may corrupt comparator decisions.

A controller 17 is interfaced with each of the charge-injection cells 18 in analog-to-digital converter (ADC) circuit 10. The controller 17 in turn operates each of the charge-injection cells 18 to quantize value of the input signal. In one embodiment, the controller 17 is implemented as a microcontroller. It should be understood that the logic for the controlling the charge-injection cells can be implemented in hardware logic, software logic, or a combination of hardware and software logic. In this regard, controller 17 can be or can include any of a digital signal processor (DSP), microprocessor, microcontroller, or other programmable device which are programmed with software implementing the above described methods. It should be understood that alternatively the controller is or includes other logic devices, such as a Field Programmable Gate Array (FPGA), a complex programmable logic device (CPLD), or application specific integrated circuit (ASIC). When it is stated that controller 17 performs a function or is configured to perform a function, it should be understood that controller 17 is configured to do so with appropriate logic (such as in software, logic devices, or a combination thereof).

Figure 3:
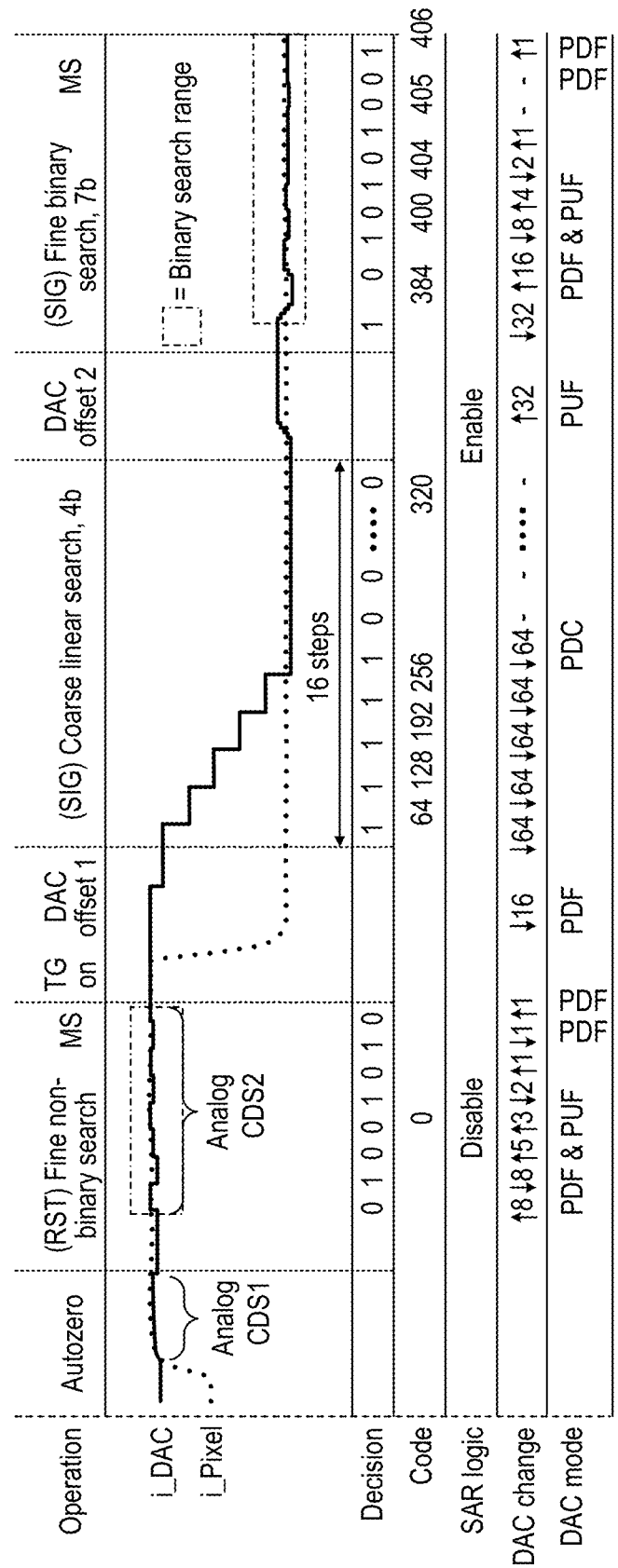
FIG. 3 is a diagram illustrates a row conversion sequence using the ADC circuit.

To quantize the input signal, the analog-to-digital converter (ADC) circuit 10 may be operated in different ways by the controller 17. FIG. 3 illustrates one way to operate the ADC circuit 10. Dual correlated double sampling is performed in the analog domain. The first is performed during auto-zeroing. The second is performed by a non-binary search with fine charge-injection cells that match the DAC output (i_DAC) voltage to the i_pixel voltage. Unlike a conventional capacitive DAC, the ADC circuit 10 does not require the fine correlated double sampling search code to be remembered and subtracted from the final signal code, thereby simplifying the ADC operation.

The controller 17 then quantizes value of the input signal using a coarse linear search followed by a binary search. The signal value quantization first uses a coarse linear search (4 bit) instead of a binary search, which offers three advantages: 1) smaller and regular changes in DAC voltage allow for the use of a slow, low-power pre-amplifier; 2) the pull-up coarse (PUC) path can be omitted; and 3) noisy PDC operation is avoided at darker light levels where its higher DAC noise (due to its high gain) impacts image quality more significantly. This is unlike a binary search, which involves noisy PDC/PUC operations regardless of light level. To further this improvement, the DAC value is shifted lower with PDF operation before entering the coarse linear search to avoid any PDC operations for the dark level.

Next, a 7b fine binary search is performed with a 1b redundant range, where the DAC voltage is again offset to the center of the coarse search step to maximize overlap. Unlike a conventional capacitive SAR ADC, a non-binary search can be easily programmed since the sequence of operations is not restricted by the hardware configuration. It is readily understood that the above search scheme is merely illustrative and other search schemes can be implemented given the configurability of the ADC circuit 10.

Figure 4:
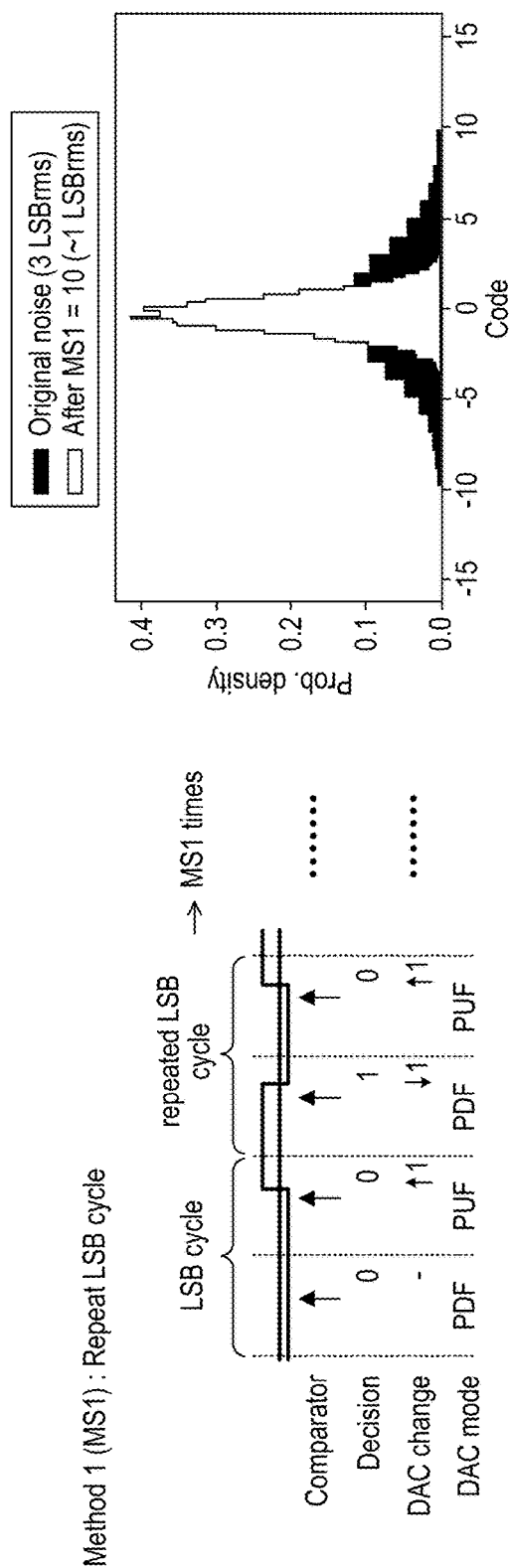
FIG. 4 is a diagram illustrating one example approach for reducing noise using multiple sampling.
Figure 5:
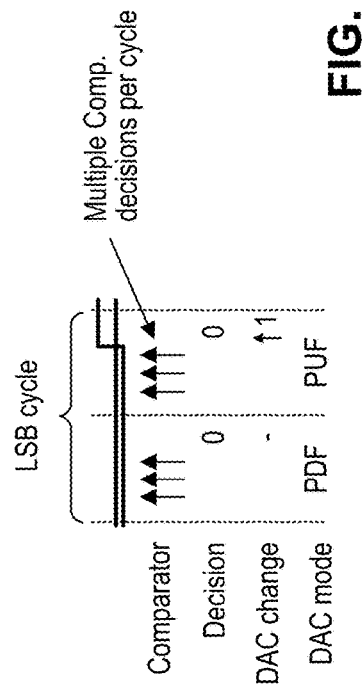
FIG. 5 is a diagram illustrating another example approach for reducing noise using multiple sampling.

Another advantage of this flexibility is the option to perform multiple sampling to reduce noise. In the example embodiment, the ADC circuit 10 quantizes the value of the input signal as a binary integer using successive approximation cycles. In one example, the controller 17 repeats the quantization of the least significant bit (LSB) of the binary integer multiple times. The DAC value is bound to approach the signal mean. Once approach (with small DAC step), the DAC value does not deviate far from the signal mean as seen in FIG. 4. When the noise level is comparable to the LSB size, this first approach is both effective and energy efficient. In another example, the controller 17 fires the comparator 15 multiple times during a given cycle as seen in FIG. 5. The value for the given cycle is then based on the multiple outputs from the comparator during the given cycle (e.g., majority rule). This second approach is effective when noise source are at high power mode.

Although not limited thereto, the ADC circuit 10 is particularly suitable for use with an image sensor. An example arrangement for an image sensor 60 is further described in relation to FIG. 6. The image sensor 60 includes a row driver 61, a controller 17, an array of pixel units 63 and a series of ADC circuits 10. The array of pixel units 63 is comprised of pixel units 62. Each pixel unit 62 is configured to perform a photoelectric conversion. In other words, the pixel unit converts light to an analog electrical signal. The photoelectric conversion operation of each pixel unit may be in response to a signal from the row driver 61. Pixel units 62 in each column of the array of pixel units 63 are electrically coupled to a corresponding ADC circuit 10. Each ADC circuit 10 operates in the manner described above. That is, the ADC circuit 10 converts the analog signal from a pixel unit into a digital signal in accordance with control signals received from the controller 17. The image sensor 60 may also include logic and a memory unit for processing and storing the converted digital signal as described below. It is to be understood that only the relevant components of the image sensor in relation to FIG. 6, but that other components may be needed to control and manage the overall operation of the system. It is also understood that the configuration of components in relation to rows and columns may be reversed in some embodiments.

In another aspect of this disclosure, n-way side-stepping mapping is used to enable low power motion detection. Specifically, the motion detection pixels are subsampled every nth-column and ith-row. For row r, a motion detection pixel at coordinate (r·i, c·n), where c={0, 1, . . . }, is re-routed sideways to column (c·n+r) for data retention and in-column motion detection computation. As readout progresses vertically across subsampled motion detection rows, the mapped ADCs shift horizontally, and all motion detection pixels are mapped to corresponding column ADC circuits 10.

Figure 6:
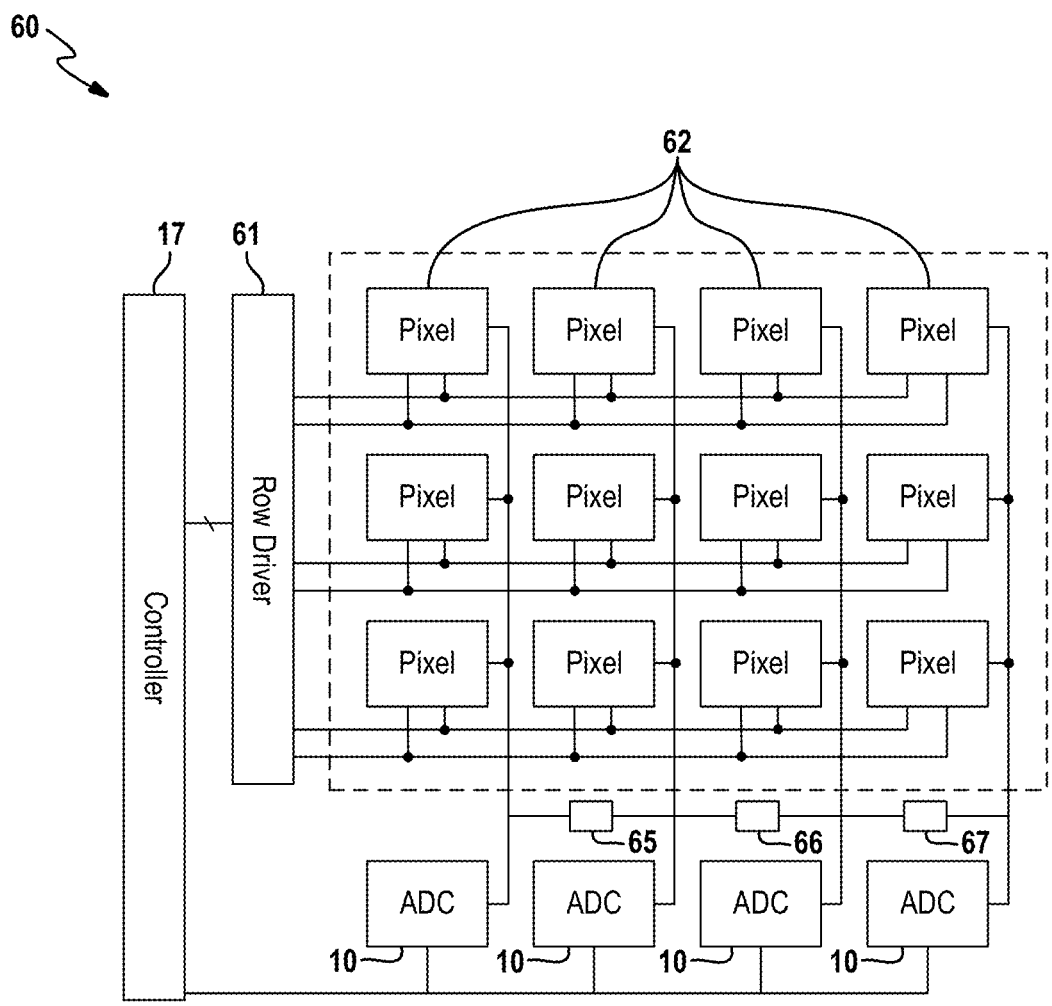
FIG. 6 is a diagram depicting an example arrangement for an image sensor, where n-way side-step mapping is used to enable low-power motion detection operation.

To enable the mapping, in-column switches 65, 66, 67 are interposed between the pixel units forming a column and its adjacent neighboring column. With reference to FIG. 6, the mapping scheme is further illustrated. To subsample the first pixel in row one, switches 65, 66 and 67 remain open. A drive signal is then applied by the row driver 61 to row one and the pixel value is converted and stored by the corresponding ADC circuit in column one. To subsample the first pixel of row two, switch 65 in between column one and column two is closed while the remaining switches 66, 67 may remain open. A drive signal is then applied by the row driver 61 to row two and the pixel value in the first column of row two is converted and stored by the corresponding ADC circuits in column two. This process is repeated for pixels on different rows and/or columns to acquire the data for the motion detection frame.

In one example, the subsample stride (n, i) and resulting motion detection frame size (h, v) are configurable with the constraint that h·v<k, where k is the total number of full active-array columns (640 for VGA). Skipped pixels can be enabled and binned together to minimize blind spots using three methods: floating diffusion (FD) binning on 2 shared Gr-Gb pixels, source-follower (SF) binning across horizontal/vertical direction, and digital binning in the column logic. For an evaluation case, n=20 and i=24, resulting in an motion detection frame resolution of 20×32 pixels.

For motion detection, the storage of the motion detection pixel values and the differencing of values between motion detection frames reuse in-column hardware of the ADC circuit 10, thereby incurring minimal area overhead. This allows motion detection without transferring the motion pixel values to external storage for motion frame differencing. Unlike prior in-pixel analog motion detection, which degraded pixel performance by −25 dB compared to typical 4T pixels, the proposed motion detection approach maintains an unmodified conventional 4T pixel structure for high image quality. In one embodiment, the complete image sensor 60 was implemented in a 65-nm CIS process with VGA active resolution and achieves 70.1 uJ/full-array or 167.5 pJ/frame/pixel, which is 2.4× lower than recent prior art, and consumes only 1.7 uJ/motion detection-frame (64.7×lower) in continuous motion detection mode. While reference has been made to the ADC circuit 10 described above, the concept of implementing motion detection hardware and logic inside an ADC circuit of an image sensor is not limited to the particular design for ADC circuit 10.

Figure 7A:
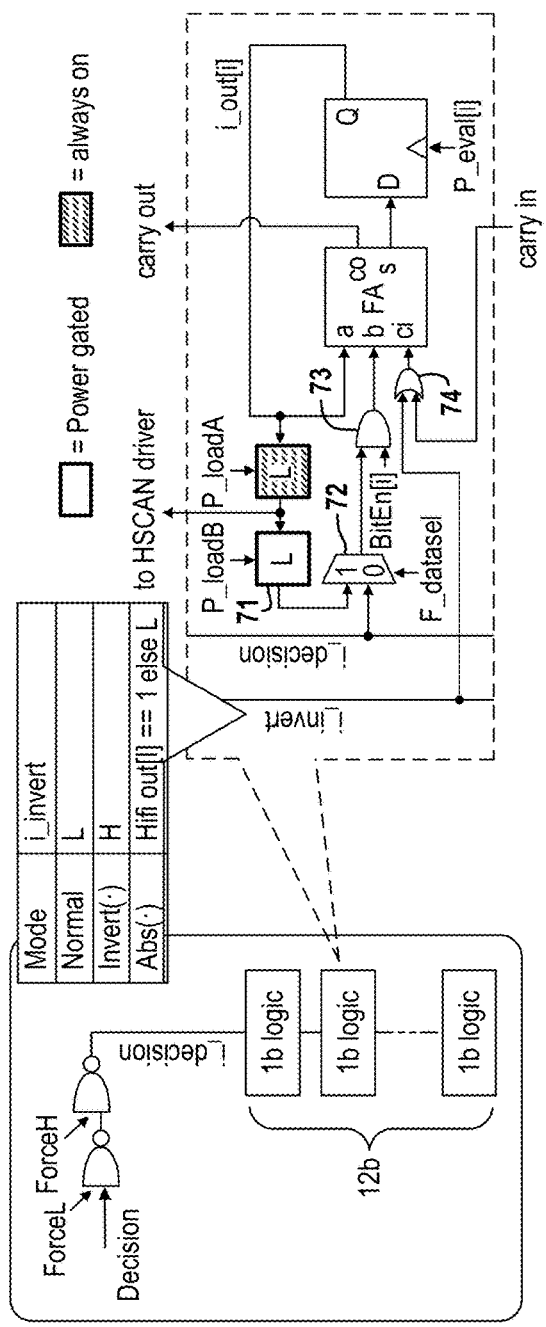
FIGS. 7A-7B are diagrams showing circuits and algorithms for in-column motion evaluation in the image sensor.
Figure 7B:
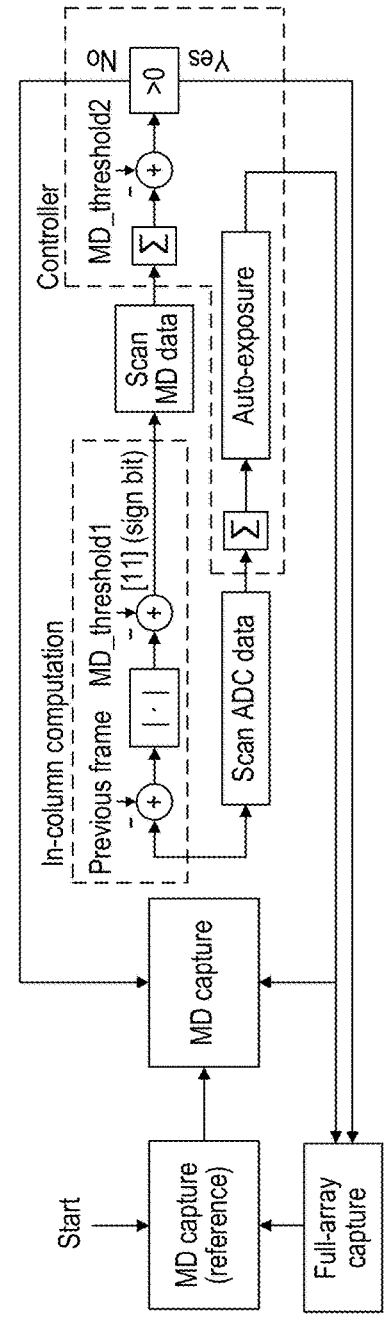

FIGS. 7A and 7B depict an example embodiment of circuits and algorithms for in-column motion evaluation. With reference to FIG. 7A, the pixel value from the decision circuit 16 of the ADC circuit 10 has twelve bit resolution. Logic circuit for each bit includes a memory device 71 for storing the value from the previous frame and additional circuitry for comparing the value for the current frame to the value for the previous frame. In the example embodiment, the memory device is further defined as a latch circuit. The additional circuitry may include a multiplexer 72, an AND gate 73, and an OR gate although other implementations are contemplated by this disclosure. In the example embodiment, the image sensor is designed primarily with thick oxide transistors to enable a low-power standby mode; column logic circuits use standard thin-oxide devices but are power gated.

With reference to FIG. 7B, the logic circuit implements four unit operations: 1) arbitrary number addition/subtraction, 2) bit inversion, 3) absolute value, and 4) storage. Using these four operations, one can store the pixel value for the previous frame and compare it with the pixel value from the current frame. In this example, the controller 17 gathers and accumulates the motion detection flags (i.e., sign-bit of difference result) along with the frame values to determine whether to proceed to full capture and to adjust exposure value. From amongst the subset of motion detection pixels, the number of pixels having changed between frames is compared to a threshold. When the number of changed pixels exceeds the threshold, the image sensor 60 proceed with capturing the entire current frame; otherwise, the image sensor 60 may elect to ignore or skip the current frame.

Figure 8:
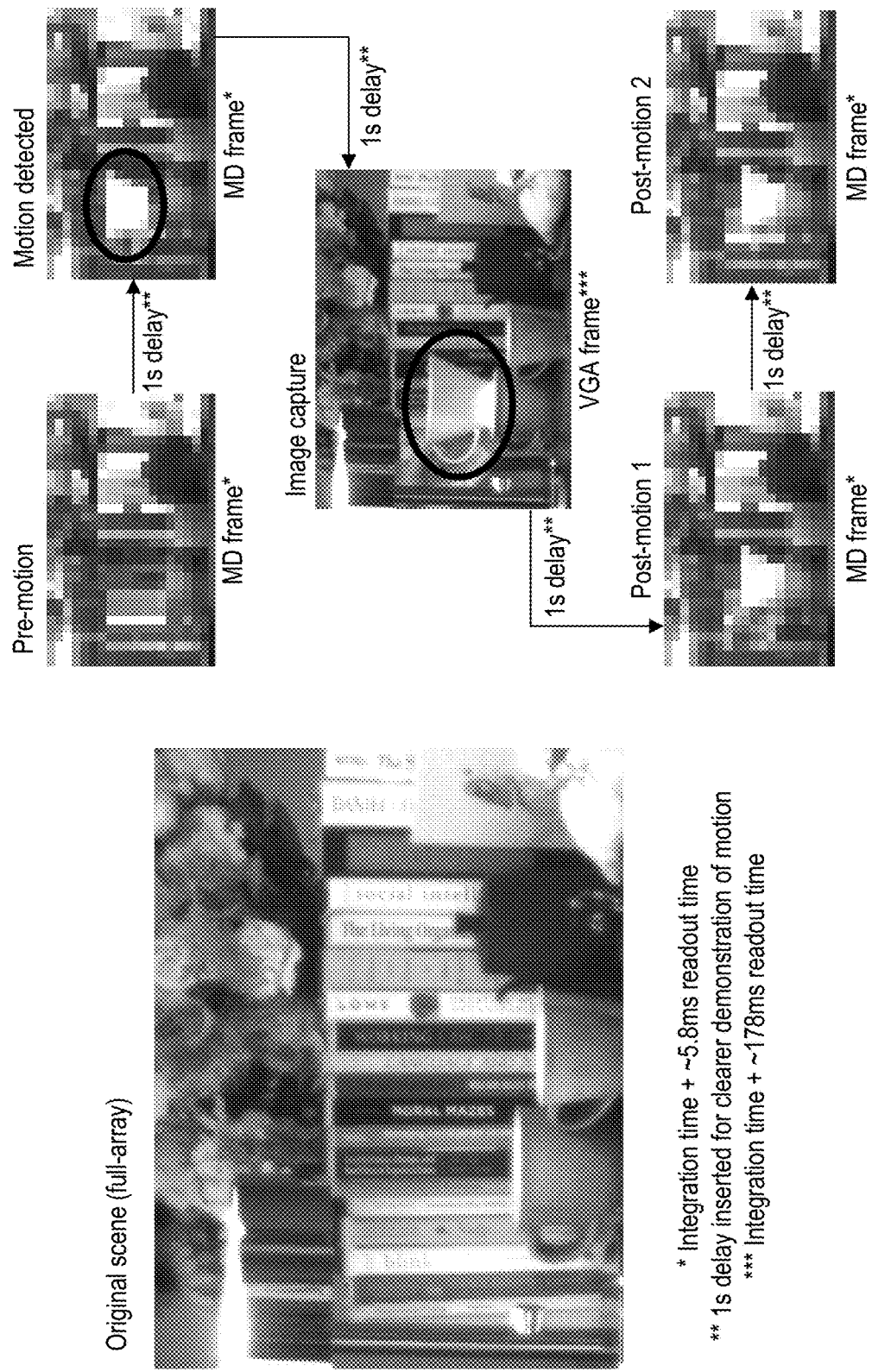
FIG. 8 are captured images from the full-array mode and motion detection of the image sensor, where the sequence of images (right) shows the sensor in motion detection mode successfully triggering a full-array capture when motion (red circle) is detected.

FIG. 8 shows captured images from full-array and motion detection operation. The energy efficiency of the complete sensor is 37.9 uV·nJ (ADC FoM). However, this number is dominated by the fully programmable controller (for flexible testing purposes); a simple hardwired state machine could be used in a more lightweight implementation. Excluding the controller energy consumption and evaluating only the readout energy (pixel, ADC and stream-out), E/frame/pix is 63.6 pJ, and the ADC FoM is 14.4 uV·nJ. The E/frame/pix in motion detection mode is 230.5 times smaller than that of a single-slope sensor. Also, the sensor can operate with its on-chip PMU, which generates internal voltages from a single external 2.5V battery, enabling integration into an IoT sensor.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An analog-to-digital converter circuit, comprising:
   a comparator configured to receive an input signal and a reference voltage; and
   a digital-to-analog converter (DAC) circuit having an output node electrically coupled to an input of the comparator and configured to output the reference voltage to the comparator, wherein the DAC circuit includes two or more charge paths electrically coupled to the output node;
   each charge path is formed by one or more charge-injection cells electrically coupled via a gain capacitor to the output node, and a charge conversion capacitor electrically coupled in parallel with the one or more charge-injection cells;
   each charge-injection cell is configured to transfer a fixed amount of charge from a charge source to an associated charge path and includes at least one switch configured to isolate the charge source from the output node.

2. The analog-to-digital converter circuit of claim 1 wherein each charge-injection cell includes a first transistor, a second transistor and a source capacitor, where the first transistor is in series with the second transistor and the source capacitor is electrically coupled to a node interconnecting the first transistor and the second transistor.

3. The analog-to-digital converter circuit of claim 2 wherein each charge-injection cell further includes a biasing transistor interconnected between the first transistor and the second transistor, such that the biasing transistor is in a cascoded arrangement with the first transistor and the source capacitor is electrically coupled to a node interconnecting the biasing transistor and the second transistor.

4. The analog-to-digital converter circuit of claim 3 further includes a controller is electrically coupled to a control terminal of the biasing transistor, where magnitude of the charge transferred by corresponding charge-injection cell directly correlates with voltage applied to the control terminal of the biasing transistor by the controller.

5. The analog-to-digital converter circuit of claim 1 wherein capacitance of the gain capacitors varies across the two or more charge paths.

6. The analog-to-digital converter circuit of claim 1 further includes a controller interfaced with each of the charge-injection cells in each of the two or more charge paths, where the controller quantizes value of the input signal by adjusting magnitude of the reference voltage in accordance with a coarse linear search followed by a binary search.

7. The analog-to-digital converter circuit of claim 1 further includes a controller interfaced with each of the charge-injection cells in each of the two or more charge paths and operates each of the charge-injection cells in each of the two or more charge paths to quantizes value of the input signal using a binary integer, where quantization of least significant bit of the binary integer is repeated multiple times.

8. The analog-to-digital converter circuit of claim 1 further includes a controller interfaced with each of the charge-injection cells in each of the two or more charge paths and operates each of the charge-injection cells in each of the two or more charge paths to quantizes value of the input signal using successive approximation cycles, where the comparator is fired multiple times within a given cycle and a value for the given cycle is based on multiple outputs from the comparator during the given cycle.

9. The analog-to-digital converter circuit of claim 1 integrated into an image sensor.

10. An analog-to-digital converter circuit, comprising:
a comparator configured to receive an input signal and a reference voltage; and
a digital-to-analog converter (DAC) circuit having an output node electrically coupled to an input of the comparator and configured to output the reference voltage to the comparator, wherein the DAC circuit includes three charge paths electrically coupled to the output node;
each charge path includes a charge conversion capacitor, a gain capacitor and a plurality of charge-injection cells, where each charge-injection cell in the plurality of charge-injection cells is electrically coupled to the output node, the gain capacitor is electrically coupled in series between the output node and the plurality of charge-injection cells and the charge conversion capacitor is electrically coupled in parallel with the plurality of charge-injection cells;
each charge-injection cell is configured to transfer a fixed amount of charge from a charge source to an associated charge path and includes at least one switch configured to isolate the charge source from the output node.

11. The analog-to-digital converter circuit of claim 10 wherein each charge-injection cell includes a first transistor, a second transistor and a source capacitor, where the first transistor is in series with the second transistor and the source capacitor is electrically coupled to a node interconnecting the first transistor and the second transistor.

12. The analog-to-digital converter circuit of claim 11 wherein each charge-injection cell further includes a biasing transistor interconnected between the first transistor and the second transistor, such that the biasing transistor is in a cascoded arrangement with the first transistor and the source capacitor is electrically coupled to a node interconnecting the biasing transistor and the second transistor.

13. The analog-to-digital converter circuit of claim 12 further includes a controller is electrically coupled to a control terminal of the biasing transistor, where magnitude of the charge transferred by corresponding charge-injection cell directly correlates with voltage applied to the control terminal of the biasing transistor by the controller.

14. The analog-to-digital converter circuit of claim 10 wherein capacitance of the gain capacitors varies across the three charge paths.

15. The analog-to-digital converter circuit of claim 10 further includes a controller interfaced with each of the charge-injection cells in each of the three charge paths, where the controller quantizes value of the input signal by adjusting magnitude of the reference voltage in accordance with a coarse linear search followed by a binary search.

16. The analog-to-digital converter circuit of claim 10 further includes a controller interfaced with each of the charge-injection cells in each of the three charge paths and operates each of the charge-injection cells in each of the three charge paths to quantizes value of the input signal using a binary integer, where quantization of least significant bit of the binary integer is repeated multiple times.

17. The analog-to-digital converter circuit of claim 10 further includes a controller interfaced with each of the charge-injection cells in each of the three charge paths and operates each of the charge-injection cells in each of the three charge paths to quantizes value of the input signal using successive approximation cycles, where the comparator is fired multiple times within a given cycle and a value for the given cycle is based on multiple outputs from the comparator during the given cycle.

18. The analog-to-digital converter circuit of claim 10 integrated into an image sensor.

19. An image sensor comprising:
an array of pixel units arranged in rows and columns, each pixel unit configured to perform a photoelectric conversion and output an analog signal;
a series of analog-to-digital converter (ADC) circuits, wherein, for each column in the array of pixel units, pixel units in a given column are electrically coupled to one of the ADC circuit in the series of ADC circuits; and
a controller interfaced with each of the ADC circuits in the series of ADC circuits,
wherein each ADC circuit includes
a comparator configured to receive an analog signal from a pixel unit and a reference voltage; and
a digital-to-analog converter (DAC) circuit having an output node electrically coupled to an input of the comparator and configured to output the reference voltage to the comparator, wherein the DAC circuit includes two or more charge paths electrically coupled to the output node;
each charge path is formed by one or more charge-injection cells electrically coupled via a gain capacitor to the output node, and a charge conversion capacitor electrically coupled in parallel with the one or more charge-injection cells;

each charge-injection cell is configured to transfer a fixed amount of charge from a charge source to an associated charge path and includes at least one switch configured to isolate the charge source from the output node.

20. The image sensor of claim 19 wherein each ADC circuit further includes a memory device configured to store a pixel value from a previous image frame and logic circuits that operate to compare a pixel value from a current image frame to the pixel value from the previous image frame.

21. The image sensor of claim 19 wherein the controller samples a subset of the pixel units in the array of pixel units and determines whether to capture pixel values for the entire array of pixel units based on change detected in the pixel values from the subset of pixel units.

22. The image sensor of claim 21 further comprises a set of switches interfaced with the controller, each switch in the set of switches is disposed between pixel units forming a given column and an ADC circuit in a column adjacent to the given column.

23. The image sensor of claim 22 wherein the controller selectively applies a drive signal to rows in the array of pixel units and operates the switches in the set of switches to sample a subset of the pixel units in the array of pixel units.

* * * * *